United States Patent
Tsay et al.

(10) Patent No.: US 6,648,208 B2
(45) Date of Patent: Nov. 18, 2003

(54) METHOD OF MANUFACTURING A JOINT BETWEEN METAL AND A CERAMIC SUBSTRATE FOR A HIGH TEMPERATURE SENSOR

(76) Inventors: Leu-Wen Tsay, 1Fl., No. 6, Lane 28, Shialuen Rd., Wenshan Chiu, Taipei (TW); Ren-Kae Shiue, No. 161-1, Jshiue Hsin Tsuen, 29 Lin, Jshiue Tsuen, Shoufeng Shiang, Hualien (TW)

(*) Notice: Subject to any disclaimer, the term of this patent is extended or adjusted under 35 U.S.C. 154(b) by 0 days.

(21) Appl. No.: 10/218,051

(22) Filed: Aug. 12, 2002

(65) Prior Publication Data

US 2003/0141348 A1 Jul. 31, 2003

(30) Foreign Application Priority Data

Jan. 30, 2002 (TW) ........................................ 91101583 A

(51) Int. Cl.$^7$ ................................................ B23K 31/02
(52) U.S. Cl. .................. 228/123.1; 228/120; 228/246; 228/248.1; 228/294; 228/256
(58) Field of Search ................... 228/120, 122.1, 228/123.1, 124.5, 124.1–124.6, 262.3–262.44, 245–262; 29/592.1, 825, 829, 843, 875, 879

(56) References Cited

U.S. PATENT DOCUMENTS

| | | | | |
|---|---|---|---|---|
| 5,180,440 A | * | 1/1993 | Siegel et al. | 136/230 |
| 5,209,390 A | * | 5/1993 | Temple et al. | 228/180.22 |
| 5,497,546 A | * | 3/1996 | Kubo et al. | 29/843 |
| 6,148,900 A | * | 11/2000 | Yamasaki et al. | 164/80 |
| 6,488,199 B1 | * | 12/2002 | Schwaiger et al. | 228/122.1 |

* cited by examiner

*Primary Examiner*—M. Alexandra Elve
*Assistant Examiner*—Kevin McHenry
(74) *Attorney, Agent, or Firm*—Thomas, Kayden, Horstemeyer & Risley

(57) ABSTRACT

A method of manufacturing a joint between metal and a ceramic substrate for a high temperature sensor. First, a predetermined hole is formed in the ceramic substrate to serve as a joint portion. A bonding layer is preferably disposed on the ceramic substrate to form on the inner surface and the surrounding portion of the hole. Next, the hole is filled with a supporting metal. Then, a conductive layer is formed on the supporting metal and the bonding layer. A metal signal conductive frame is then formed on the conductive layer. Next, a welding spot is formed through the metal signal conductive frame, the conductive layer and the supporting metal at the joint portion by a welding process.

16 Claims, 2 Drawing Sheets

METHOD OF MANUFACTURING A JOINT BETWEEN METAL AND A CERAMIC SUBSTRATE FOR A HIGH TEMPERATURE SENSOR

BACKGROUND OF THE INVENTION

1. Field of the Invention

The present invention relates to the manufacture of a joint between metal and a ceramic substrate, more particularly to a method of manufacturing a high reliability joint between metal and a ceramic substrate for a high temperature sensor.

2. Description of the Related Art

High temperature sensors comprising a ceramic material, a joint, and a metal wire have been widely used at high temperature (exceeding than 800° C.) and thermal cycle environments such as the engine of an automobile.

Ceramic materials such as aluminum oxide, silicon carbide, or silicon nitride are typically bonded with ionic bonds or covalent bonds and have brittle properties. Metallic materials have metallic bonds and are tough. In addition, thermal expansion coefficients of the metallic materials are generally larger than those of the ceramic materials. The different thermal expansion coefficients between the ceramic materials and the metallic materials result in thermal stresses at the joint or interface between these materials after joining. Moreover, the tensile thermal stresses are generated within the ceramic materials so that the joint or the ceramic materials will be damaged.

Therefore, it is important to develop methods to decrease the thermal stresses near the interfaces between ceramic materials and metallic materials. One method to reduce or eliminate the thermal stresses is to use an inter-layer, serving as the joint, with a multiple-layer structure between the ceramic materials and the metallic materials. The inter-layer must have high toughness, adapted thermal expansion coefficient, and low yield strength, providing plastic deformation during thermal cycle so as to decrease the thermal stresses.

Nonetheless, it is difficult to find a suitable stacked composition for the inter-layer material. Furthermore, the inter-layer can accumulate large plastic deformations during repeated thermal cycles. As a result, the inter-layer is susceptible to damage under many heating and cooling cycles.

Another method to reduce or eliminate thermal stresses is to use functionally graded materials (FGMs) to serve as the joint materials. That is to say, the thermal expansion coefficient of the joint element gradually alters by mixing and sintering of a specific ratio of different materials. However, the composition of functionally graded materials is not easily adjusted.

Even with the advancements mentioned above, there remains a considerable and continuous effort to further improve the high temperature durability of a joint between a metallic material and a ceramic substrate by selecting a material having an adopted thermal expansion coefficient for the joint component.

SUMMARY OF THE INVENTION

In view of the above disadvantages, an object of the invention is to provide a method of manufacturing a joint between metal and a ceramic substrate for a high temperature sensor. The joint has good high temperature durability, enhanced thermal fatigue resistance and high reliability so that the sensor is suitable for an environment having elevated temperature, vibration, or thermal cycles.

Accordingly, the objects are attained by providing a method of manufacturing a joint between metal and a ceramic substrate for a high temperature sensor. First, a predetermined hole is formed in the ceramic substrate to serve as a joint portion. A bonding layer is preferably disposed on the ceramic substrate to form on the inner surface and the surrounding portion of the hole. Next, the hole is filled with a supporting metal. Then, a conductive layer is formed on the supporting metal and the bonding layer. A metal signal conductive frame is then formed on the conductive layer. Next, a welding spot is formed through the metal signal conductive frame, the conductive layer and the supporting metal at the joint portion by a welding process.

A further object of the invention is to provide a method of manufacturing a joint between metal and a ceramic substrate for a high temperature sensor. The formation of the bonding layer can further comprise the steps of:

mixing a precious metal powder and a ceramic powder to form a mixture;

coating the mixture on the ceramic substrate; and sintering the mixture to generate a bonding layer.

Moreover, the formation of the conductive layer further comprises the steps of:

mixing 50–99% by weight of a precious metal powder and 1–50% by weight of a ceramic powder to form a mixture;

coating the mixture on the ceramic substrate; and sintering the mixture to generate a conductive layer.

In accordance with one aspect of the invention, there is provided a method of manufacturing a joint between metal and a ceramic substrate for a high temperature sensor. The supporting metal is preferably a nickel-based alloy, a cobalt-based alloy, an iron-based alloy, a metal matrix composite, or platinum.

In accordance with another aspect of the invention, there is provided a method of manufacturing a joint between metal and a ceramic substrate for a high temperature sensor. The formation of the supporting metal further comprises of the steps of:

providing a metallic material of a solid rod, a sheet material, or a powder; and pressing and/or sintering the metallic material to form a supporting metal.

In accordance with further aspects of the invention, there is provided a method of manufacturing a joint between metal and a ceramic substrate for a high temperature sensor. The metal signal conductive frame is preferably a nickel-based alloy, a cobalt-based alloy, or an iron-based alloy.

In accordance with a still further aspect of the invention, there is provided a method of manufacturing a joint between metal and a ceramic substrate for a high temperature sensor. The welding process is preferably laser-beam welding, electron-beam welding, tungsten inert gas welding, plasma-arc welding, or resistance welding.

BRIEF DESCRIPTION OF THE DRAWINGS

The preferred embodiment of the invention is hereinafter described with reference to the accompanying drawings in which.

DETAILED DESCRIPTION OF THE INVENTION

The invention provides an improved method of manufacturing a joint between metal and a ceramic substrate for a high temperature sensor. The joint has enhanced high temperature durability, enhanced resistance to thermal fatigue and high reliability so that the sensor can be suitable for an environment having elevated temperature, vibration, or high number of thermal cycles.

Figure 1:
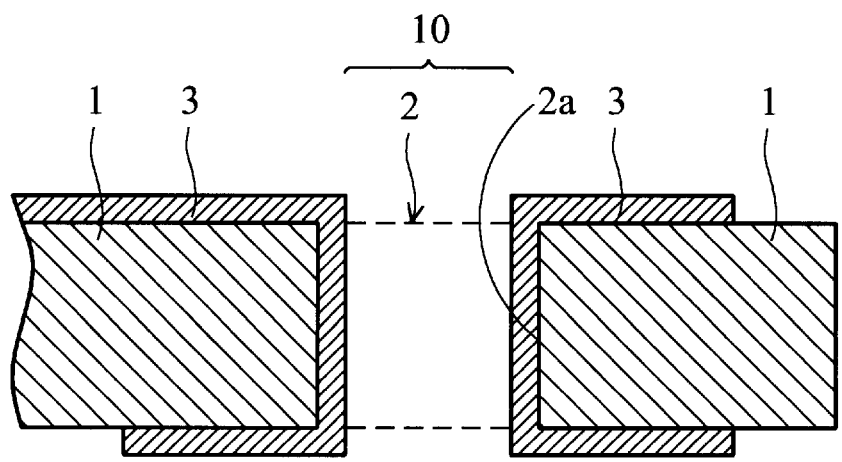
FIG. 1 is a cross section showing a ceramic substrate having a hole and a bonding layer formed therein according to the present invention.

Referring to FIG. 1, an insulating ceramic substrate 1 consisting of aluminum oxide ($Al_2O_3$) is provided. A predetermined hole 2, serving as the joint portion 10 in which the joint or the welding spots will be formed, is formed through the ceramic substrate 1. Next, a bonding layer 3 is preferably formed on the inner surface 2a and the surrounding portion of the hole 2. That is to say, a mixture of a precious metal powder (such as platinum) and a ceramic powder having low melting point is coated on the ceramic substrate 1 followed by sintering the mixture thereby forming the bonding layer 3. Also, the bonding layer 3 must have the characteristics:

(a) The thermal expansion coefficient of the bonding layer 3 is close to that of the ceramic substrate 1, thus reducing thermal stresses between the bonding layer 3 and the ceramic substrate 1 in a high temperature environment.

(b) The bonding layer 3 has good adhesion to the ceramic substrate 1.

(c) The bonding layer 3 consists of a material having good resistance to high temperature or high temperature durability.

Figure 2:
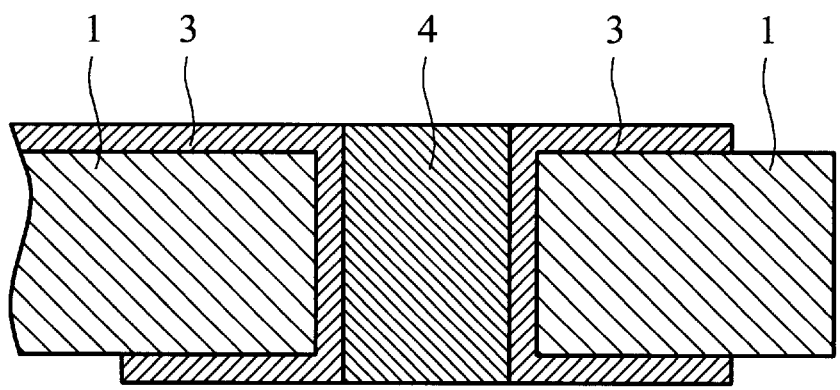
FIG. 2 is a cross section showing a ceramic substrate of FIG. 1 with a supporting metal filled in the hole.

Turning now to FIG. 2, The supporting metal 4 such as a nickel-based alloy, a cobalt-based alloy, an iron-based alloy, a metal matrix composite material, or platinum is filled in the hole 2. The thermal expansion coefficient of the supporting metal 4 is preferably similar to that of the ceramic substrate 1. Also, the supporting metal 4 preferably has good resistance to high temperature. Alternately, a metallic material of a solid rod, a sheet material, or a powder can be applied in the hole 2 followed by pressing and/or sintering of the metallic material to form a supporting metal 4.

Figure 3:
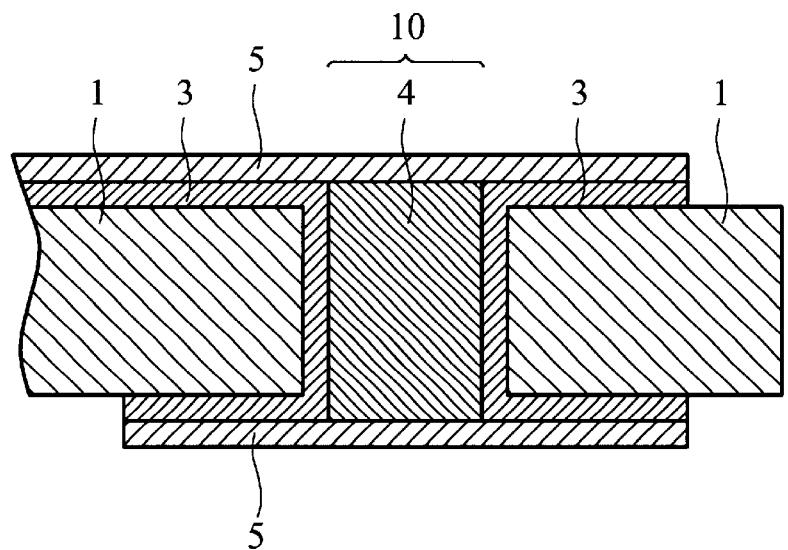
FIG. 3 is a cross section showing a ceramic substrate of FIG. 2 with a conductive layer formed on the supporting metal and the bonding layer.

Next, as shown in FIG. 3, a conductive layer 5 is coated and formed on the supporting metal 4 and the bonding layer 3 at the joint portion 10. That is to say, 50–99% by weight of a precious metal powder (such as platinum) and 1–50% by weight of a ceramic powder is mixed to form a mixture. Alternately, palladium, iridium, rhodium, osmium, ruthenium, gold, silver and their alloys can be used as the precious metal to replace platinum. The mixture is coated on the ceramic substrate 1 followed by sintering the mixture to generate a conductive layer 5 connected to ceramic substrate 1 through bonding layer 3.

Figure 4:
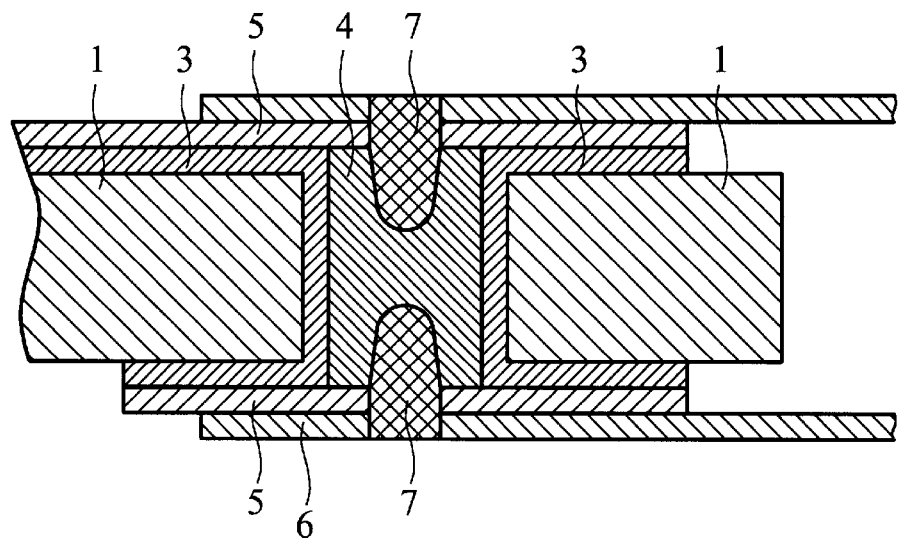
FIG. 4 is a cross section showing a ceramic substrate of FIG. 3 after the ceramic substrate has been subjected to a welding process to form welding spots through the metal signal conductive frame formed on the conductive layer, the conductive layer and the supporting metal.

Turning now to FIG. 4, a metal signal conductive frame 6 of a nickel-based alloy, a cobalt-based alloy, or an iron-based alloy is formed on the conductive layer 5. The metal signal conductive frame preferably has good resistance to high temperature. Next, welding spots 7 are formed through the metal signal conductive frame 6, the conductive layer 5 and the supporting metal 4 at the joint portion 10 by a welding process. Moreover, the welding process can be carried out by laser-beam welding, electron-beam welding, tungsten inert gas welding, plasma-arc welding, or resistance welding. The welding spots 7 are formed within the metal signal conductive frame 6, the conductive layer 5 and the supporting metal 4 thereby forming a firm joint compare with the joint formed by the conventional method.

Alternately, a welding spot formed on the single surface of the ceramic substrate can be used to replace the welding spots on both the upper surface and the lower surface of the ceramic substrate described above.

According to the embodiment of the invention, the welding spots (joint) have good high temperature durability, enhanced thermal fatigue resistance and high reliability so that the sensor can be suitable for an environment having elevated temperature, vibration, or many thermal cycles.

While the invention has been described with reference to various illustrative embodiments, the description is not intended to be construed in a limiting sense. Various modifications of the illustrative embodiments, as well as other embodiments of the invention, will be apparent to those skilled in the art upon reference to this description. It is therefore contemplated that the appended claims will cover any such modifications or embodiments as may fall within the scope of the invention defined by the following claims and their equivalent.

What is claimed is:

1. A method of manufacturing a joint between metal and a ceramic substrate for a high temperature sensor, comprising the steps of:

forming a hole in the ceramic substrate to serve as a joint portion;

disposing a bonding layer on the ceramic substrate to form on an inner surface and a surrounding portion of the hole;

filling the hole with a supporting metal;

forming a conductive layer on the supporting metal and the bonding layer;

forming a metal signal conductive frame on the conductive layer; and forming a welding spot through the metal signal conductive frame, the conductive layer and the supporting metal at the joint portion by a welding process.

2. A method of manufacturing a joint between metal and a ceramic substrate for a high temperature sensor as claimed in claim 1, wherein the formation of the bonding layer further comprises the steps of:

mixing a precious metal powder and a ceramic powder;

coating the mixture on the ceramic substrate; and sintering the mixture to generate a bonding layer.

3. A method of manufacturing a joint between metal and a ceramic substrate for a high temperature sensor as claimed in claim 2, wherein the precious metal is platinum, palladium, iridium, rhodium, osmium, ruthenium, gold, silver or their alloys.

4. A method of manufacturing a joint between metal and a ceramic substrate for a high temperature sensor as claimed in claim 1, wherein the formation of the conductive layer further comprises the steps of:

mixing 50–99% by weight of a precious metal powder and 1–50% by weight of a ceramic powder to form a mixture;

coating the mixture on the ceramic substrate; and sintering the mixture to generate a conductive layer.

5. A method of manufacturing a joint between metal and a ceramic substrate for a high temperature sensor as claimed in claim 4, wherein the precious metal is platinum, palladium, iridium, rhodium, osmium, ruthenium, gold, silver or their alloys.

6. A method of manufacturing a joint between metal and a ceramic substrate for a high temperature sensor as claimed in claim 1, wherein the supporting metal is a nickel-based alloy, a cobalt-based alloy, an iron-based alloy, a metal matrix composite material, or platinum.

7. A method of manufacturing a joint between metal and a ceramic substrate for a high temperature sensor as claimed in claim 1, wherein the formation of the supporting metal further comprises of the steps of:

providing a metallic material of a solid rod, a sheet material, or a powder; and pressing and/or sintering the metallic material to form a supporting metal.

8. A method of manufacturing a joint between metal and a ceramic substrate for a high temperature sensor as claimed in claim 1, wherein the metal signal conductive frame is a nickel-based alloy, a cobalt-based alloy, or an iron-based alloy.

9. A method of manufacturing a joint between metal and a ceramic substrate for a high temperature sensor as claimed in claim 1, wherein the welding process is laser-beam welding, electron-beam welding, tungsten inert gas welding, plasma-arc welding, or resistance welding.

10. A method of manufacturing a joint between metal and a ceramic substrate for a high temperature sensor, comprising the steps of:

forming a hole in the ceramic substrate to serve as a joint portion;

filling the hole with a supporting metal;

forming a conductive layer on the supporting metal;

forming a metal signal conductive frame wire on the conductive layer; and forming a welding spot through the metal signal conductive frame, the conductive layer and the supporting metal at the joint portion by a welding process.

11. A method of manufacturing a joint between metal and a ceramic substrate for a high temperature sensor as claimed in claim 10, wherein the formation of the conductive layer further comprises the steps of:

mixing 50–99% by weight of a precious metal powder and 1–50% by weight of a ceramic powder to form a mixture;

coating the mixture on the ceramic substrate; and sintering the mixture to generate a conductive layer.

12. A method of manufacturing a joint between metal and a ceramic substrate for a high temperature sensor as claimed in claim 11, wherein the precious metal is platinum, palladium, iridium, rhodium, osmium, ruthenium, gold, silver or their alloys.

13. A method of manufacturing a joint between metal and a ceramic substrate for a high temperature sensor as claimed in claim 10, wherein the supporting metal is made of a nickel-based alloy, a cobalt-based alloy, an iron-based alloy, a metal matrix composite material, or platinum.

14. A method of manufacturing a joint between metal and a ceramic substrate for a high temperature sensor as claimed in claim 10, wherein the formation of the supporting metal further comprises the steps of:

providing a material of a solid rod, a sheet material, or a powder; and pressing and/or sintering the material to form a supporting metal.

15. A method of manufacturing a joint between metal and a ceramic substrate for a high temperature sensor as claimed in claim 10, wherein the metal signal conductive frame wire is a nickel-based alloy, a cobalt-based alloy, or an iron-based alloy.

16. A method of manufacturing a joint between metal and a ceramic substrate for a high temperature sensor as claimed in claim 10, wherein the welding process is laser-beam welding, electron-beam welding, tungsten inert gas welding, plasma-arc welding, or resistance welding.

\* \* \* \* \*